United States Patent
Baumgartner et al.

(10) Patent No.: US 7,573,937 B2
(45) Date of Patent: Aug. 11, 2009

(54) PHASE ROTATOR CONTROL TEST SCHEME

(75) Inventors: Steven J. Baumgartner, Zumbro Falls, MN (US); Anthony R. Bonaccio, Shelburne, VT (US); Timothy C. Buchholtz, Rochester, MN (US); Charles P. Geer, Rochester, MN (US); Daniel G. Young, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 618 days.

(21) Appl. No.: 11/155,027

(22) Filed: Jun. 16, 2005

(65) Prior Publication Data

US 2006/0285583 A1 Dec. 21, 2006

(51) Int. Cl.
*H04B 3/46* (2006.01)
*H04B 17/00* (2006.01)
*H04Q 1/20* (2006.01)

(52) U.S. Cl. .................. 375/226; 375/224; 324/500; 324/537; 324/763; 702/117; 702/57; 702/69

(58) Field of Classification Search ............ None
See application file for complete search history.

(56) References Cited

U.S. PATENT DOCUMENTS 6,005,507 A * 12/1999 Nakatsu et al. ............ 341/155
6,380,984 B1 * 4/2002 Inoue et al. ................ 348/569
6,754,613 B2 * 6/2004 Tabatabaei et al. ......... 702/189
7,062,696 B2 * 6/2006 Barry et al. ................ 714/738
7,099,424 B1 * 8/2006 Chang et al. ............... 375/370
2002/0136165 A1 * 9/2002 Ady et al. .................. 370/241
2004/0070746 A1 * 4/2004 Lewis et al. ................ 356/5.01
2006/0023825 A1 * 2/2006 Kato et al. ................. 375/372
2006/0026475 A1 * 2/2006 Arnold et al. .............. 714/730
2007/0047337 A1 * 3/2007 Iizuka ....................... 365/193

* cited by examiner

*Primary Examiner*—Shuwang Liu
*Assistant Examiner*—Gina McKie
(74) *Attorney, Agent, or Firm*—Patterson & Sheridan LLP

(57) ABSTRACT

Techniques and apparatus for testing phase rotators for detecting defective tap weights are provided. Phase rotator test logic may include a master phase rotator to cycle the phase of a clock signal distributed to operational phase rotators through an entire cycle of phases (e.g., an entire 360 degree rotation). Each operational phase rotator should respond with an equal but opposite phase shift in order to maintain phase lock. Thus, after sweeping, each tap weight is exercised, which may help ensure defective tap weights in any (e.g., quadrant) are detected during testing.

7 Claims, 4 Drawing Sheets

PHASE ROTATOR CONTROL TEST SCHEME

CROSS-REFERENCE TO RELATED APPLICATIONS

This application is related to co-pending U.S. patent application entitled, "Jitter Generator to Simulate a Closed Data Eye" Ser. No. 11/155,028, filed herewith.

BACKGROUND OF THE INVENTION

1. Field of the Invention

The present invention generally relates to integrated circuit testing and, more particularly, to testing phase rotators to ensure the integrity of phase rotator tap weights used to produce an output signal with a desired phase.

2. Description of the Related Art

Phase rotators, also known as phase interpolators, are used to construct an output signal having a phase that is related to the phase of a second signal in some desirable way. Phase rotators are often used in serial data transmission and receiving circuitry as a component for aligning a sampling clock to recover serial data. Phase rotators typically generate an output signal having a phase with a known relationship to the serial data. The output signal is typically generated from a mix of incoming signals having defined offset phase relationships (commonly referred to as phasors).

For example, as illustrated in FIG. 1, a phase rotator 100 may mix four phasors 102 with relative phase offsets of 0 degrees, 90 degrees, 180 degrees, and 270 degrees, in N discrete combinations (by applying different weights to each) to create an output signal with N discrete phases between 0 and 360 degrees. Weights to be applied to each phasor 102 may be specified by a weight code 104 (illustratively, a string of 32 bits).

As illustrated in FIG. 2, which lists exemplary phasor weights and resultant output phases, the entire unit circle (0-360 degrees) can be achieved by mixing various weights of either 2 or 3 of the input phasors 102. The table shows output phases at 45 degree increments. At these points, the phasor weights are always either off or on fully to create the phases as shown. In between these points there is an interpolation applied to create the intermediate phases.

The weighting function may be fairly close to linear. For example, at 45 degrees the 0 and 90 degree phasor weights are on full and the 180 and 270 weights are off. For the next phase step (e.g., about 51 degrees, assuming 64 phase steps of approx. 6 degrees each) the 0 weight would be decreased slightly from its max value, pulling the output phase toward 90. However, during manufacturing of integrated circuits, there can be defects that could produce opens or shorts causing one or more of the tap weights to be ineffective. If a defective tap weight exists, the mixing operation will produce output phases different from those desired.

Unfortunately, in most test systems, and in most on chip built in self test (BIST) algorithms, clock and data signals are all produced from the same reference clock signal. This results in a relatively high probability with normal manufacturing process variations that delays in the clock and data signal paths may be such that the defective tap weight in the phase rotator might be in a phase quadrant (e.g., 0, 90, 180, or 270) that is not required to produce the desired phase.

Consequently, the chip may function correctly through BIST or manufacturing test operations, but fail when put into the field where it is exposed to different data paths and different operating environments bringing the defective tap into play. In other words, the phase rotator might have to adjust its resultant phase to include the defective tap weight and the incorrect rotator output phase could produce errors in serial data reception.

Accordingly, what is needed is a technique for testing phase rotators to ensure defective tap weights are detected.

SUMMARY OF THE INVENTION

The present invention generally provides methods and apparatus for testing phase rotators.

One embodiment provides a method of testing a phase rotator circuit used in a data processing circuit, comprising. The method generally includes generating a phase-adjusted clock signal based on a reference clock signal, distributing the phase-adjusted clock signal to the phase rotator circuit of the data processing circuit, sweeping the phase of the phase-adjusted clock signal over a predetermined sweep range to induce corresponding phase changes in the phase rotator circuit in the data processing circuit, and monitoring the data processing circuit for errors during the sweeping to detect defects in the phase rotator circuit.

Another embodiment provides an integrated circuit device including one or more data processing circuits, each having a phase rotator to adjust a phase of a clock signal received by the data processing circuits, and phase rotator logic. The phase rotator test logic is generally configured to adjust the phase of the clock signal received by the one or more data processing circuits over a sweep range during a test mode in order to detect defects in the phase rotators of the data processing circuits.

Another embodiment provides a system generally including a tester and an integrated circuit device coupled to the tester via a multi-bit interface. The integrated circuit device generally includes a plurality of data processing circuits, each configured to receive data over one line of the multi-bit interface and having a phase rotator to adjust a phase of a clock signal to which the data is synchronized, and phase rotator test logic. The phase rotator test logic is configured to adjust the phase of the clock signal received by the data processing circuits over a sweep range during a test mode in order to detect defects in the phase rotators of the data processing circuits.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention generally provides a technique and apparatus for testing phase rotators to ensure defective tap weights are detected. For some embodiments, phase rotator test logic includes a master phase rotator to rotate (or sweep) the phase of a clock signal distributed to operational phase rotators through an entire cycle of phases (e.g., an entire 360 degree rotation). Each operational phase rotator should respond with an equal but opposite phase shift in order to maintain phase lock. Thus, after sweeping, each tap weight is exercised, which may help ensure defective tap weights are detected during testing.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Exemplary Phase Rotator Test Logic

Figures 1, 2:
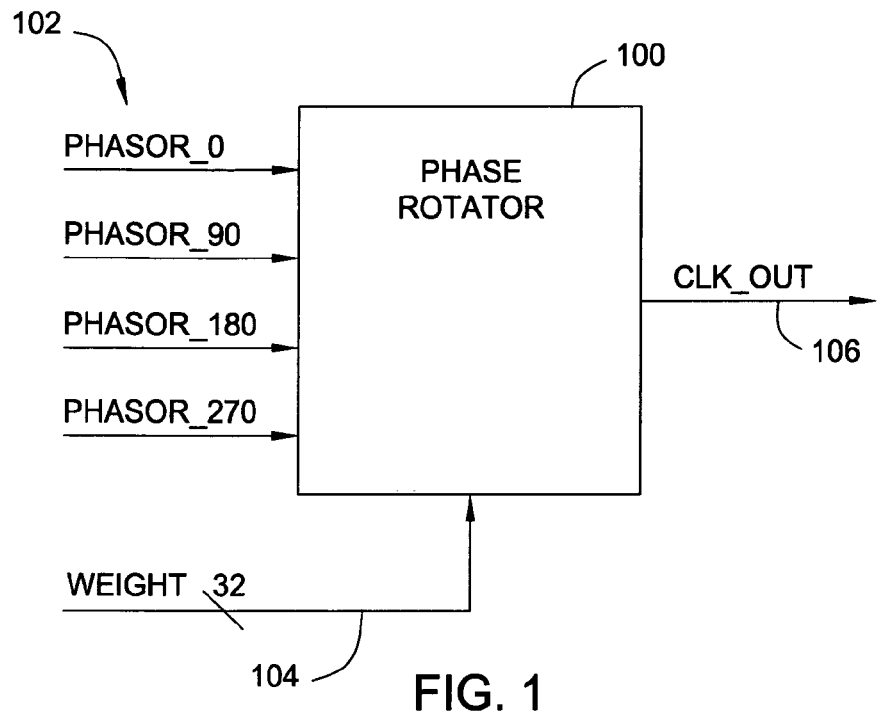
FIG. 1 illustrates an exemplary phase rotator.
FIG. 2 is a table of phasor weights and corresponding phase outputs.
Figure 3:
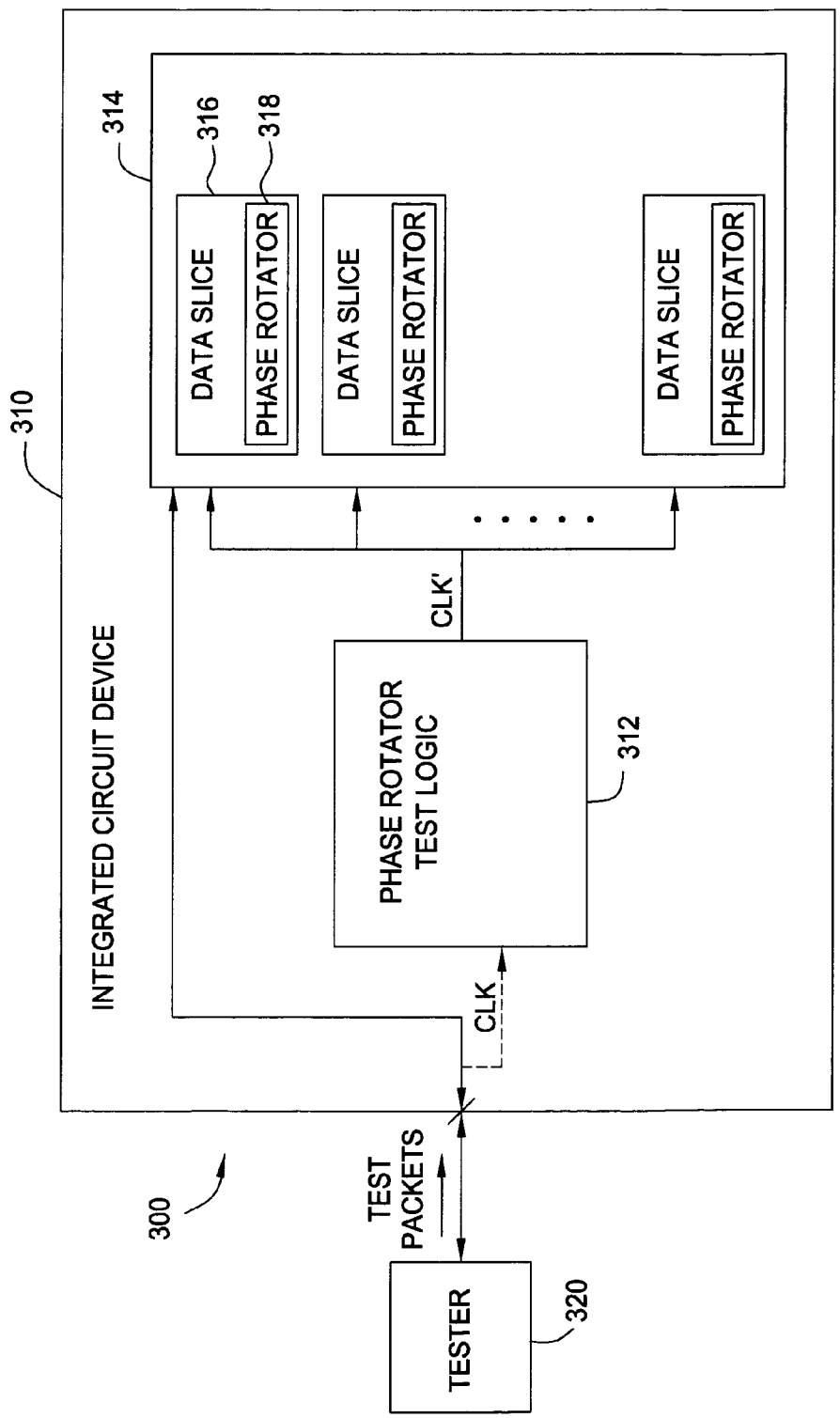
FIG. 3 illustrates an exemplary integrated circuit with phase rotator test logic, in accordance with one embodiment of the present invention.

FIG. 3 illustrates an exemplary system 300 for testing an integrated circuit (IC) device 310 having phase rotator test logic 312 in accordance with embodiments of the present invention. The IC device 310 may be any type of device utilizing one or more operational phase rotators 318 to adjust the phase of a signal distributed within the device.

For example, the IC device 310 may be a central processing unit (CPU) or graphics processing unit (GPU). In such cases, the phase rotators 318 may be included as part of de-skew circuitry in a physical layer of a communications interface used to exchange data serially (e.g., with the tester 320 or another IC device). A clock signal may be distributed to different data processing circuits (labeled data slices) 316 that each receive a serial bit of data in conjunction with the clock signal over a different bit line of a multi-bit serial interface. The phase rotator 318 in each data slice 316 may be configured to align the clock signal with the serial data.

In order to test for defective tap weights within the phase rotators 318, during a test mode, the phase rotator test logic 312 may be configured to sweep the phase of the clock signal distributed to the data slices 316. Each phase step during the sweep should result in an equal and opposite phase shift by the phase rotators 318.

If all tap weights are functioning properly, each operational phase rotator 318 should respond with an equal but opposite phase shift in order to maintain phase lock. Thus, after sweeping the entire phase range, each tap weight in the phase rotators 318 should be exercised. The tester 320 (or another IC device) may exchange test (or ping) data packets during this testing to detect defective tap weights. The ping packets may be designed only for testing and thus, may not contain any real data of interest. However, the ping packets may include an appended checksum (e.g., a CRC) calculated based on the content of the remainder of the packet. The device 310 may then detect errors by generating its own checksum and comparing the generated checksum to the appended checksum sent with the ping packet. A mismatch indicates an error, which may be due to a defective tap weight. In some cases, rather than use an external tester 320 (or other external device) to generate ping packets, a loop-back path may be provided whereby the device itself generates and transmits the ping packets which are fed back to the receiver circuit.

Figure 4:
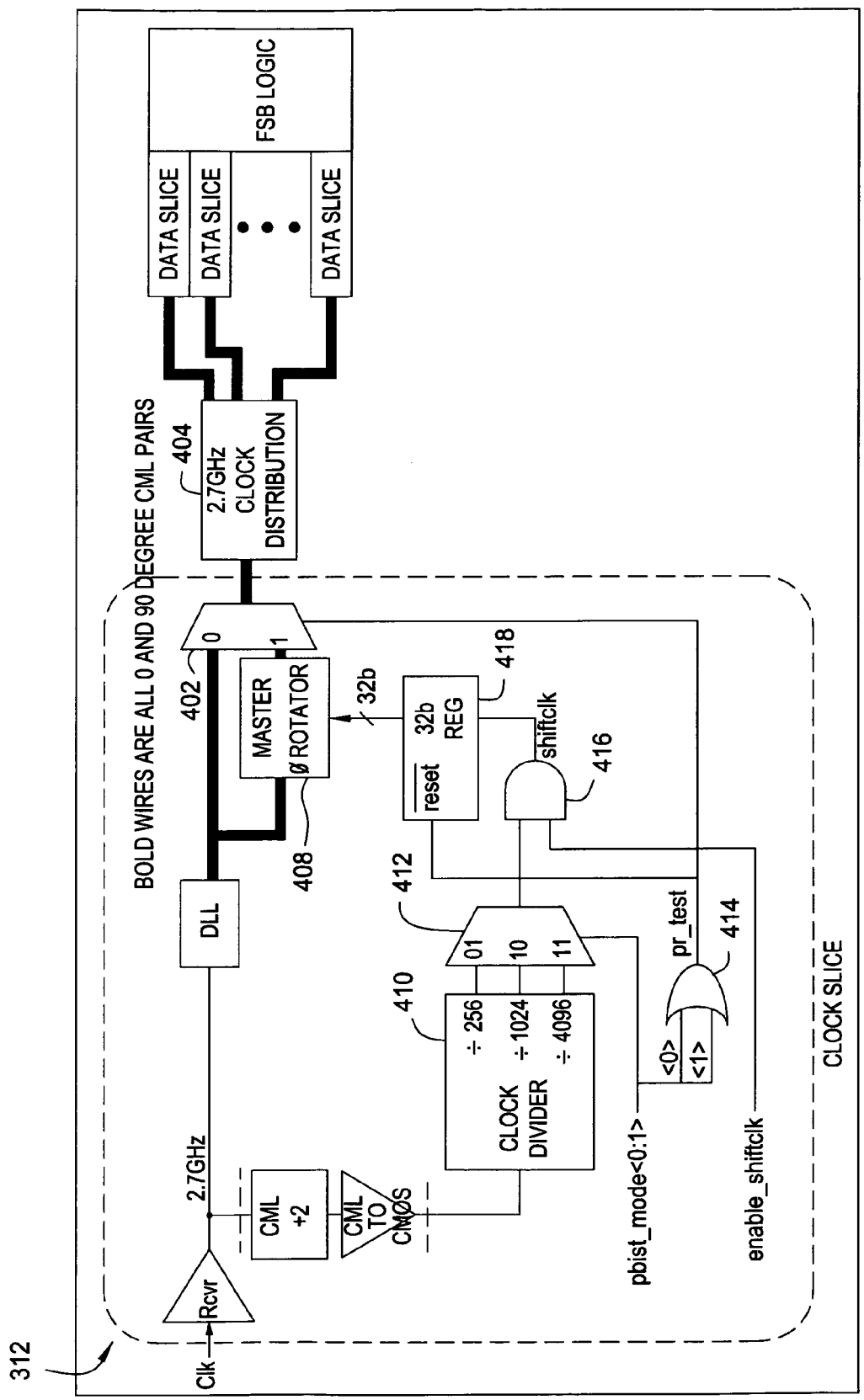
FIG. 4 illustrates a detailed view of the phase rotator test logic in accordance with one embodiment of the present invention.

FIG. 4 illustrates exemplary circuitry for implementing the phase rotator test logic 312 according to one embodiment. A master phase rotator 408 may be controlled to vary the phase of the incoming clock signal during a ping built-in self-test (PBIST) in which ping packets are received and checked for errors. In order to maximize analog tracking and match the phase shifts of the master phase rotator 408 to those of the operational phase rotators 318, the master phase rotator 408 and operational phase rotators 318 may utilize a common design cell.

The varied clock signal may be selected by a multiplexor (mux) 402 for distribution by clock distribution logic 404 to the data slices 316. The mux 402 may be controlled by a signal generated when a test mode is enabled such that the varied clock signal is selected when the test mode is enabled and the normal clock signal is selected otherwise.

The phase of the varied clock signal generated by the master rotator 408 may be swept by periodically incrementing a weight code generated by weight control logic 418. For some embodiments, the weight code may be a 32-bit "thermometer" code that is incremented in conjunction with some number of clock signals when the test mode is enabled. As illustrated, when the shift clock is enabled, via an enable_shiftclk signal controlling an AND gate 416, the weight control logic 418 may increment the weight code in response to a signal generated by a clock divider circuit 410.

The exact period of the shift clock may be determined by one or more bits in a control register (pbist_mode[0:1]). For example, as illustrated in TABLE I below, these control bits may be used to enable the test mode and select one of multiple outputs from the clock divider circuit 410, via a mux 412. Assuming a 2.7 GHz clock signal, the listed clock divisors 512, 2048, and 8192, would result in code changes and corresponding phase shifts approximately every 190 ns, 758 ns, and 3034 ns, respectively.

As illustrated, when either of the pbist_mode bits are set, a pr_test signal may be asserted, via an OR gate 414, thus selecting the phase adjusted clock signal via mux 402 (rather than the reference clock signal from which it is generated).

TABLE I

Truth Table For PBIST_MODE

| PBIST[0] | PBIST[1] | DESCRIPTION |
|---|---|---|
| 0 | 0 | Functional Mode, Power Down Phase Rotator Test Logic |
| 0 | 1 | Test Mode, divide clock by 512 (phase step every 512 cycles) |
| 1 | 0 | Test Mode, divide clock by 2048 (phase step every 2048 cycles) |
| 1 | 1 | Test Mode, divide clock by 8192 (phase step every 8192 cycles) |

Selection of the particular clock divider and corresponding rate of the phase shifts may be based on the response time of the functional phase rotators 318 in tracking the rotation of the master phase rotator 408. For some embodiments, the functional phase rotators 318 may exist inside a control loop which implements a digital filter inside of a phase detector.

A multi-byte ping packet (e.g., 136 bytes long), including header and a checksum (e.g., CRC) may be monitored in order to make adjustments based on a detected phase, to the phase rotators 318 in each data slice 316. As an example, if this response time is approximately 190 ns or less, the phase step setting of pbist_mode<0:1>=01, which may correspond to a 190 ns per phase step may be used. The other settings result in slower phase shift rates and may be used to account for noise, jitter, or other effects.

Figure 5:
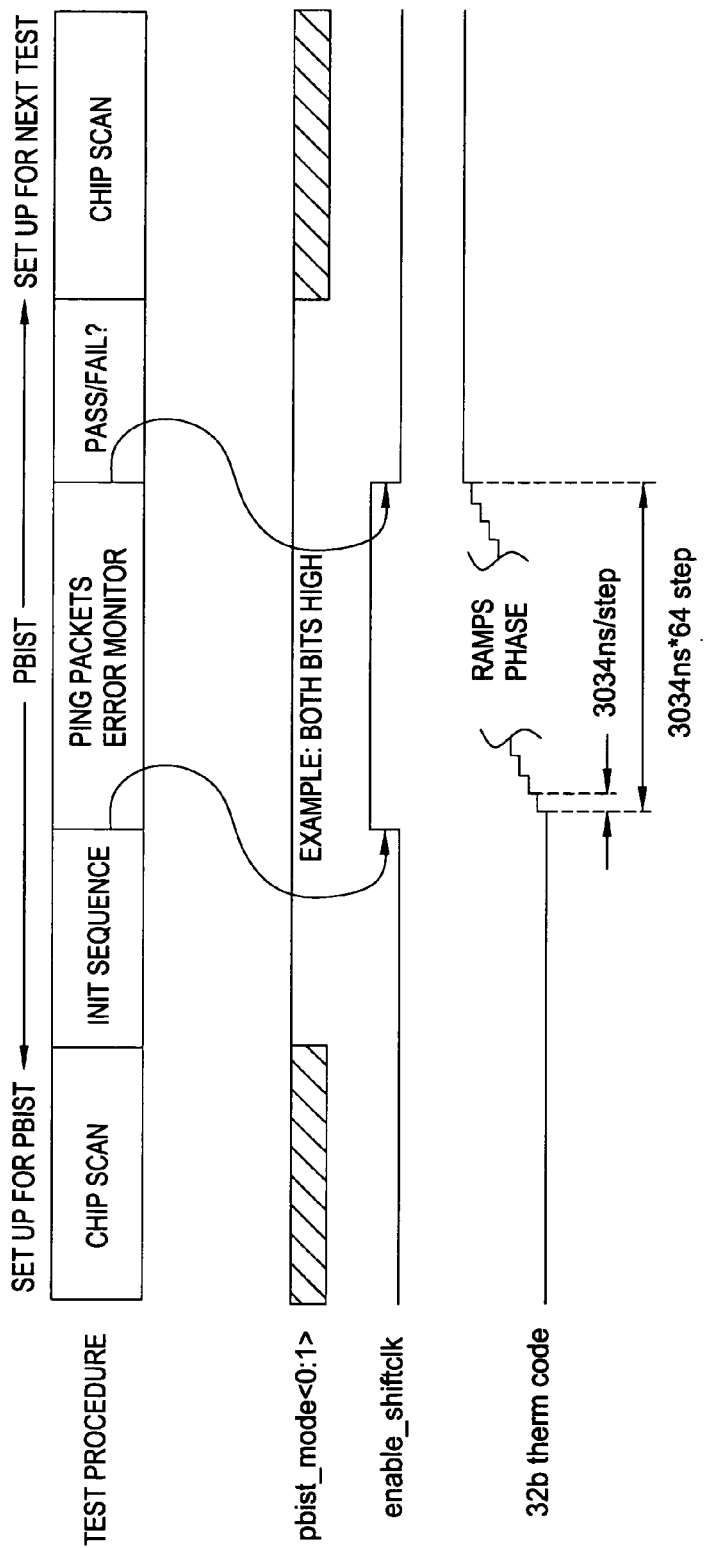
FIG. 5 is a signal timing diagram of phase rotator test logic of FIG. 4.

FIG. 5 is a signal timing diagram that illustrates operation of the Phase Rotator test logic 312 of FIG. 4. As illustrated, the PBIST (which may be initiated by a tester 320 shown in FIG. 3) may begin with an Initialization Sequence, for example, to initialize the master phase rotator 408 to produce a known phase output (e.g., 0 degrees). After the initialization sequence, the enable_shiftclk signal may be asserted, allowing the weight code generated by the master phase rotator 418 to be varied periodically to begin the phase rotation. All functional phase rotators 318 may be locked prior to this point, as well. As the phase of the clock signal is rotated, due to periodic phase shifts initiated by the clock divider circuit 410, ping packets (e.g., sent from tester 320) may be monitored for errors.

As illustrated, the weight code may be ramped up over its entire range, resulting in corresponding rotation of the clock signal phase over the entire 360 degree range. The length of time to rotate over the entire range may depend on the shift period selected by the pbist_mode bits, and total number of phase steps (which depends on how the weight code is implemented). As illustrated, assuming 64 steps, a 2.7 GHz clock, and a clock divider of 8192 (e.g., pbist_mode<0:1>=11), approximately 400 us may be required for a full 360 degree rotation. For some embodiments, the PBIST may be run longer, for example, with the weight code wrapping around, as the phase rotates back through 0 degrees.

Once the rotation is complete, the enable_shiftclk signal may be disabled, thus disabling changes to the weight code. If no errors were detected when monitoring ping packets during the PBIST, it may be concluded that all tap weights in the functional phase rotators 318 are functioning properly and the device may be considered to have passed. On the other hand, if errors were detected when monitoring ping packets during the PBIST, it may be concluded that at least some tap weights in the functional phase rotators 318 are defective and the device may be considered to have failed.

CONCLUSION

By rotating the phase of a clock signal distributed to one or more data processing circuits over an entire 360 degree range, functional phase rotators in the data processing circuits may be forced to exercise all tap weights to maintain phase lock with the clock signal. As a result, defective tap weights may be detected during testing, for example, by monitoring for errors in ping packets received by the processing circuits during testing, and before a device reaches the field.

While the foregoing is directed to embodiments of the present invention, other and further embodiments of the invention may be devised without departing from the basic scope thereof, and the scope thereof is determined by the claims that follow.

What is claimed is:

1. A method of testing a phase rotator circuit used in a data processing circuit, comprising:
   generating a phase-adjusted clock signal based on a reference clock signal;
   distributing the phase-adjusted clock signal to the phase rotator circuit of the data processing circuit;
   receiving a plurality of data packets, wherein each data packet comprises a plurality of data bits and one or more first error checking bits;
   sweeping the phase of the phase-adjusted clock signal over a predetermined sweep range to induce corresponding phase changes in the phase rotator circuit in the data processing circuit, while receiving the plurality of data packets;
   determining one or more second error checking bits for each data packet received based on the plurality of data bits; and
   determining whether the phase rotator circuit is defective based on a comparison between the one or more first error checking bits and the one or more second error checking bits.

2. The method of claim 1, wherein distributing the phase-adjusted clock signal to the phase rotator circuit of the data processing circuit, comprises:
   generating a test signal when entering a test mode; and
   controlling a multiplexor with the test signal to distribute the phase-adjusted clock signal to the phase rotator circuit of the data processing circuit.

3. The method of claim 1, wherein generating the phase-adjusted clock signal comprises generating the phase-adjusted clock signal with a master phase rotator.

4. The method of claim 3, wherein generating the phase-adjusted clock signal with the master phase rotator comprises varying a multi-bit weight code provided to the master phase rotator.

5. The method of claim 4, wherein varying the multi-bit weight code comprises:
   generating a delayed clock signal with a clock divider circuit; and
   adjusting the multi-bit weight code in conjunction with the delayed clock signal.

6. The method of claim 5, wherein generating the delayed clock signal with a clock divider circuit comprises selecting one of a plurality of delayed clock signals generated by the clock divider circuit, each having a different period.

7. The method of claim 1, wherein the sweep range is from 0 to 360 degrees.

* * * * *